United States Patent
Chiasson et al.

(10) Patent No.: US 8,129,947 B2
(45) Date of Patent: *Mar. 6, 2012

(54) METHOD AND SYSTEM FOR UTILIZING A MEMORY CONTROL CIRCUIT FOR CONTROLLING DATA TRANSFER TO AND FROM A MEMORY SYSTEM

(75) Inventors: Shane Chiasson, Pflugerville, TX (US); Ligong Wang, Round Rock, TX (US); John J. Breen, Harker Heights, TX (US)

(73) Assignee: Dell Products L.P., Round Rock, TX (US)

( * ) Notice: Subject to any disclaimer, the term of this patent is extended or adjusted under 35 U.S.C. 154(b) by 1040 days.

This patent is subject to a terminal disclaimer.

(21) Appl. No.: 12/012,142

(22) Filed: Jan. 31, 2008

(65) Prior Publication Data

US 2009/0195212 A1    Aug. 6, 2009

(51) Int. Cl.
*H02J 7/00* (2006.01)
(52) U.S. Cl. .................. 320/132; 713/323; 713/324
(58) Field of Classification Search .......... 713/323, 713/324; 320/132
See application file for complete search history.

(56) References Cited

U.S. PATENT DOCUMENTS

| | | | |
|---|---|---|---|
| 4,553,081 A | 11/1985 | Koenck | |
| 4,709,202 A | 11/1987 | Koenck et al. | |
| 5,448,719 A | 9/1995 | Schultz et al. | |
| 5,523,671 A | 6/1996 | Stewart | |
| 5,528,122 A | 6/1996 | Sullivan et al. | |
| 5,552,953 A * | 9/1996 | Meyerdirks et al. | 361/93.1 |
| 6,137,265 A | 10/2000 | Cummings et al. | |
| 6,242,894 B1 * | 6/2001 | Patino et al. | 320/147 |
| 6,509,657 B1 | 1/2003 | Wong et al. | |
| 6,630,814 B2 | 10/2003 | Ptasinski et al. | |
| 6,708,280 B1 | 3/2004 | Tate et al. | |
| 2001/0048288 A1 | 12/2001 | Hebding et al. | |
| 2002/0167293 A1 | 11/2002 | Ptasinski et al. | |
| 2009/0195211 A1 | 8/2009 | Wang et al. | |

OTHER PUBLICATIONS

Texas Instruments, "Multichemistry Battery Charger Controller and System Power Selector", BQ24702; BQ24703, May 2003, 35 pgs.

(Continued)

*Primary Examiner* — Samuel Berhanu
(74) *Attorney, Agent, or Firm* — O'Keefe, Egan, Peterman & Enders LLP (57) ABSTRACT

Methods and systems are disclosed for utilizing a memory control circuit for controlling transfer of data to and from a memory system. A memory control circuit with a back up battery and control circuits is provided. Battery health is determined through a discharge cycle of the back up battery. A power supply generated from the back up battery is provided to circuitry of the memory control card during normal operations of the memory control circuit during a non-power loss state. The power supplied from the back up battery during the non-power loss state of the memory control circuit is utilized by at least a first circuit of the memory control circuit as part of normal memory controller card operations during the battery health discharge cycle. When the system is not performing a battery health cycle the first circuit receives normal system power. The memory control circuit may be a RAID card. The first circuit may be memory circuitry. The backup battery discharge rate may be regulated during the battery health discharge cycle by switching the power source for the circuitry of the memory control card between the backup battery and the normal system power.

20 Claims, 5 Drawing Sheets

OTHER PUBLICATIONS

Wang, "Method and System for Regulating Current Discharge During Battery Discharge Conditioning Cycle", U.S. Appl. No. 12/012,141, DELL:083, Office Action mailed Apr. 28, 2011, 17 pgs.

Wang, "Method and System for Regulating Current Discharge During Battery Discharge Conditioning Cycle", U.S. Appl. No. 12/012,141, DELL:083, Amendment: and Response to Office Action Mailed Apr. 28, 2011, 27 pgs.

* cited by examiner

METHOD AND SYSTEM FOR UTILIZING A MEMORY CONTROL CIRCUIT FOR CONTROLLING DATA TRANSFER TO AND FROM A MEMORY SYSTEM

TECHNICAL FIELD

The techniques described herein relate to a method and system for controlling data transfer to and from a data storage system, and particularly to determining battery health through a battery conditioning discharge cycle by providing a power supply generated by the battery to circuitry of a storage system control card during normal operations as part of the discharge cycle.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Figure 1:
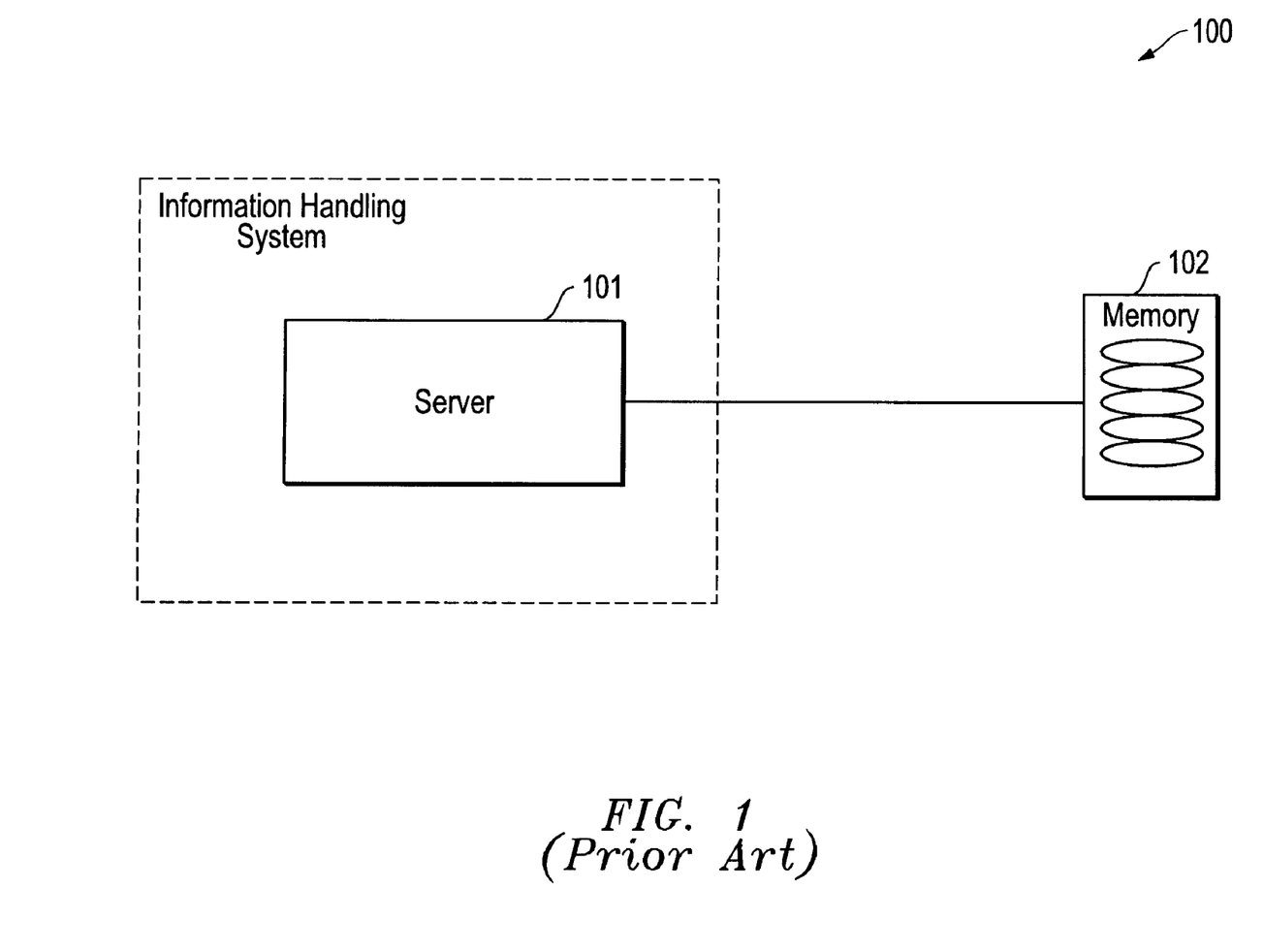
FIG. 1 is a block diagram of a prior art information handling system having a server coupled to a memory system.
Figure 2:
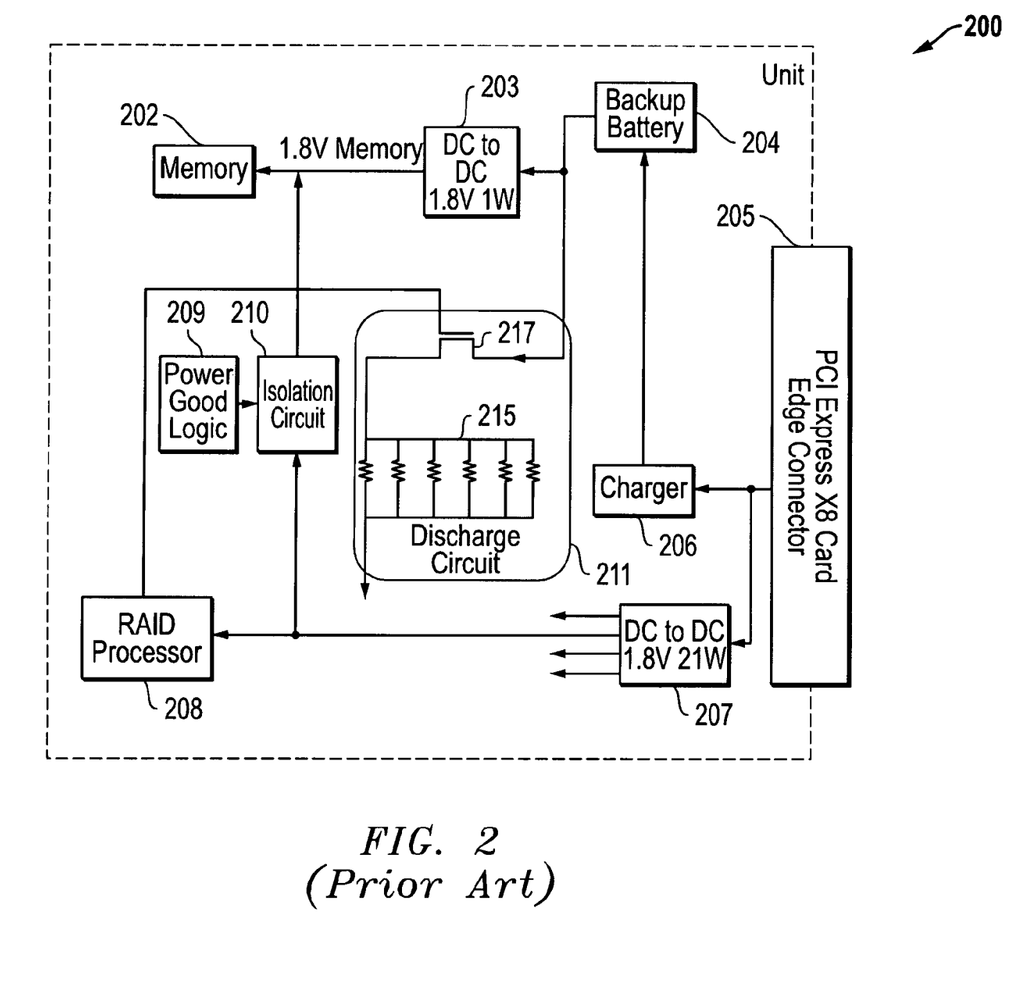
FIG. 2 is a block diagram of prior art memory storage controller card with battery back up and discharge circuit.

Current information handling systems and methods for controlling data transfer to and from a memory storage system and determining battery health are known in the art. For example, FIGS. 1 and 2 are prior art figures that illustrate the current methods of determining battery health. FIG. 1 shows a prior art information handling system 100 having a server 101 coupled to a memory storage system 102. The information handling system 100 may include a storage memory controller card within or independent of the server 101. FIG. 2 shows a prior art storage memory controller card with battery back up and a discharge circuit that may be coupled to a redundant array of independent disks (RAID) memory system. A RAID system is a data storage system wherein data is distributed across a group of storage hard disk drives functioning as a small storage unit. Often, information stored on each disk is duplicated on other disks in the array, creating redundancy to ensure no information is lost if disk failure occurs. An exemplary RAID controller circuit 200, for example a PowerEdge RAID Controller (PERC) cards available from Dell, Inc., is shown in FIG. 2. As shown in FIG. 2, the controller circuit 200 includes a cache memory 202 to improve storage performance as described below. The cache memory 202 may be for example DRAM memory such as 256 MB DDR2 memory. During operation of the controller circuit 200, user data may be transferred to/from the controller circuit 200 from/to the RAID hard disk drives (not shown in FIG. 2). As part of the transfer, prior art systems typically store data in the cache memory 202 as part of the transfer of the data to/from the RAID disk drives. If a system power loss occurs it is advantageous to be able to maintain the data transfer of the data that has already been staged in the memory cache. Thus, a backup battery 204 is utilized to provide power to the cache memory 202 so that the memory cache does not lose the data that has not yet been transferred. The battery power may thus power the memory cache until the system power becomes stable again so that data in the cache may then be reliably transferred to the RAID hard disk drives. In one example, the backup battery 204 provides power to the memory 202 via a DC to DC converter 203, which may provide a 1.8V 1 W power source to the memory 202.

Over time, the battery health can degrade such that the total charge capacity can be significantly less than that of the original battery rating. Such degradation will impact the ability to help ensure the proper transfer of data during a power loss as described above and it is desirable to determine if the battery has degraded to the point that it does not have sufficient power to accomplish this task. To determine the health of the battery 204, the controller circuit 200 performs a learn cycle, which includes discharging the battery 204 completely, then recharging it to its maximum capacity. During the recharge cycle, a management controller measures a charge rate and time to determine the total charge capacity of the battery 204, and thus its health. Current art methods of discharging a battery 204 utilize a set of power resistors to drain the charge from the battery 204 at a rate of 4 W. However, dissipation of this energy creates an undesirable temperature increase in a system that contains the controller card 200. Also requiring dissipation of the power over power resistors increases cost. Further, the use of multiple power resistors requires a significant amount of circuit board real estate. Also, the power dissipation of the battery 204 is completely lost to heat, which is environmentally inefficient. It will be recognized that in storage memory card controller applications a discharge of the battery is generally a rare occurrence and thus a separate technique is desired to determine if the battery is actually still capable of providing the desired power.

Other exemplary portions of the prior art controller card 200 will now be described. The battery 204 is charged by a charger 206 which is provided power through by a PCI Express X8 Card Edge Connector 205. The battery 204 sends power to a discharge circuit 211 which include power resistors 215 and a switch 217. When testing for the health of the battery 204, the discharge circuit 211 receives input from a RAID processor 208 which turns on the switch 217 and thus discharges the battery 204 through the power resistors 215. The Card Edge Connector 205 provides power to a second DC to DC converter 207. The DC to DC converter 207 provides a plurality of voltage supplies for operating the various components of the circuit during normal non-power loss situations (for example power is shown as being provided to the RAID processor 208). For example, the DC to DC converter 207 may be rated to provide 1.8V 21 W power. Power may be provided from the DC to DC converter 207 to the cache memory 202 through an isolation circuit 210. The isolation circuit 210 is responsive to power good logic 209. When a power loss situation occurs, power good logic 209 sends a signal to the isolation circuit 210 so that the input power supply line to the cache memory will be isolated from other circuitry (this isolates the input power supply line to receive battery power without the battery power being drained to other circuitry on the controller card 200).

It will be recognized that the problems described above relating to the undesirable power discharge techniques of the controller card are not limiting to the particular embodiment of a controller card described above. Thus, controller cards having other circuit designs may also have such undesirable power discharge techniques. It is desirable to have a system for controlling data transfer to and from a memory storage system that includes a backup battery in which battery health is monitored through a discharge cycle which lessens at least some of the problems described above.

In the past, notebook computers have employed a battery calibration function that allows the notebook computer battery to be discharged through a system load during a learn cycle such as occurs during an extended system shutdown. The discharge current value is pre-determined for such a calibration cycle based on the system configuration, such as the size of LCD panel, memory and speed of processor, etc.

SUMMARY

The techniques described herein provide a method and system for controlling data transfer to and from a memory system. According to the techniques described herein, a battery discharge for the purposes of testing the battery health may be accomplished by powering some or all of the circuits of the controller circuit during power conditions and normal operations of the controller circuit. In this manner, power need not be unnecessarily wasted, circuit real estate may be conserved and the thermal heat load produced during power discharge may be lessened. In one embodiment, the cache memory may be the circuitry that is powered from the battery during a battery health discharge cycle, however, it will be recognized that the battery power may be utilized during a discharge cycle to power other circuitry. Battery health may then be determined by monitoring the discharge and/recharge process.

Methods and systems are disclosed for utilizing a memory control circuit for controlling transfer of data to and from a memory system. A memory control circuit with a back up battery and control circuits is provided. Battery health is determined through a discharge cycle of the back up battery. A power supply generated from the back up battery is provided to circuitry of the memory control card during normal operations of the memory control circuit during a non-power loss state. The power supplied from the back up battery during the non-power loss state of the memory control circuit is utilized by at least a first circuit of the memory control circuit as part of normal memory controller card operations during the battery health discharge cycle. When the system is not performing a battery health cycle the first circuit receives normal system power. The memory control circuit may be a RAID card. The first circuit may be memory circuitry.

In one embodiment, a method for determining the health of a backup battery in storage memory controller circuitry is disclosed. The method may include providing the storage memory controller system circuitry with a back up battery and other control circuits, the back up battery providing a power source during occurrences of a system power loss condition. The method may further include commencing a battery health discharge cycle of the back up battery even though normal power conditions exist. A power supply generated from the battery is provided to at least some circuitry of the memory controller circuitry as part of the battery health discharge cycle of the back up battery that occurs while normal system power conditions exist. The method further comprises discharging at least a portion of the back up battery during the battery health discharge cycle of the back up battery that occurs while normal system power conditions exist and determining a health of the back up battery after the discharging of at least a portion of the back up battery.

In another embodiment a method of utilizing a memory control circuit for controlling a transfer of data to or from a memory storage system is disclosed. The method may comprise providing a RAID memory controller card having a back up battery and control circuits and performing a battery health cycle for determining the health of the back up battery. A back up battery generated power supply may be provided to circuitry of the RAID memory controller card during a non-system power loss state as part of the battery health cycle. Further, the method comprises discharging at least a portion of the charge of the back up battery during the non-system power loss state as part of the battery health cycle and determining a condition of the back up battery as part of the battery health cycle.

In yet another embodiment an information handling system is disclosed that may comprise a back up battery, a battery discharge signal that is indicative of an execution of a battery health cycle, and memory controller circuitry for controlling the transfer of data to and from an external data storage system. The system further comprises at least a first circuit within the memory controller circuitry that is operable in a normal power mode to receive system power in a non-power loss state, the first circuit being coupled to the back up battery during the battery health cycle so that the battery may be discharged by supplying operating power to the first circuit as part of the battery health cycle. The battery supplied operating power may be utilized to operate the first circuit during normal data transfer between the memory controller circuitry and the external data storage system.

In yet another embodiment, methods and systems may be provided to regulate battery discharge rate during a battery conditioning discharge cycle to prevent possible fault conditions such as thermal trip, extra degradation of the battery, and/or an exothermic event. Such fault conditions may occur, for example, when a memory controller (e.g., RAID memory controller) draws more current from a backup battery than the battery is rated for during conditioning, e.g., such as may occur due to high memory traffic and utilization. In one example of this embodiment, the power source for a memory controller maybe switched between the backup battery and normal system power (e.g., externally-supplied power such as DC current supplied from AC-DC regulator directly or via DC to DC converter) during a battery conditioning cycle as necessary or as otherwise desired to reduce the current drawn from the backup battery during the conditioning cycle. In this regard, power may be switched between the backup battery and the normal system power in an ad hoc manner (e.g., switched to the normal system power only when needed to reduce the current drawn from the backup battery and then switched back to the battery backup power afterward), or may be repeatedly switched back and forth between the backup battery and the normal system power according to a discharge duty cycle. Such a duty cycle may be, for example, fixed throughout the battery conditioning discharge cycle or may be continuously adjusted during the battery conditioning discharge cycle to maintain the backup battery discharge current at a designated rate. When an optional adjustable discharge duty cycle is employed during the battery conditioning discharge cycle, a target optimized backup battery discharge rate may be advantageously achieved to prevent possible damage to the backup battery or other circuitry during the conditioning cycle without unnecessarily extending the duration of the discharge time during the conditioning cycle.

As described below, other features and variations can be implemented, if desired, and a related method can be utilized, as well.

In one respect, disclosed herein is a method of determining the health of a backup battery in storage memory controller circuitry, the method including steps of: providing the storage memory controller system circuitry with a back up battery and other control circuits, the back up battery providing a power source during occurrences of a system power loss condition; commencing a battery health discharge cycle of the back up battery even though normal power conditions exist with normal system power being available; providing a power supply generated from the battery to at least some circuitry of the storage memory controller circuitry as part of the battery health discharge cycle of the back up battery that occurs while normal system power conditions exist with normal system power being available; discharging at least a portion of the back up battery during the battery health discharge cycle of the back up battery that occurs while normal system power conditions exist; regulating a discharge rate of current from the back up battery during the battery health discharge cycle by switching the power supply provided to at least some circuitry of the storage memory controller circuitry back and forth between the backup battery and the normal system power to reduce the current drawn from the backup battery during the battery health discharge cycle; and determining a health of the back up battery after the discharging of at least a portion of the back up battery.

In another respect, disclosed herein is a method of utilizing a memory control circuit for controlling a transfer of data to or from a memory storage system, the method including steps of: providing a RAID memory controller card having a back up battery and control circuits; performing a battery health cycle for determining the health of the back up battery; providing a back up battery generated power supply to circuitry of the RAID memory controller card during a non-system power loss state as part of the battery health cycle; providing a normal system power supply separate from the backup battery to circuitry of the RAID memory controller card during a non-system power loss state as part of the battery health cycle; discharging at least a portion of the charge of the back up battery during the non-system power loss state as part of the battery health cycle; regulating a discharge rate of current from the back up battery during the battery health cycle by switching the power supply provided to circuitry of the RAID memory controller card back and forth between the backup battery and normal system power to reduce the current drawn from the backup battery during the battery health cycle; and determining a condition of the back up battery as part of the battery health cycle.

In another respect, disclosed herein is an information handling system including: a back up battery; memory controller circuitry for controller the transfer of data to and from an external data storage system; at least a first circuit within the memory controller circuitry that is operable in a normal power mode to receive normal system power in a non-power loss state, the first circuit being coupled to the back up battery during the battery health cycle so that the backup battery may be discharged by supplying operating power to the first circuit as part of the battery health cycle, the battery supplied operating power being utilized to operate the first circuit during normal data transfer between the memory controller circuitry and the external data storage system; and at least one second circuit that is operable in a normal power mode to regulate a discharge rate of current from the back up battery during the battery health cycle by switching the power supply provided to the first circuit back and forth between the backup battery and the normal system power to reduce the current drawn from the backup battery during the battery health cycle.

DESCRIPTION OF THE DRAWINGS

It is noted that the appended drawings illustrate only exemplary embodiments of the techniques described herein and are, therefore, not to be considered limiting of its scope, for the techniques may admit to other equally effective embodiments.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 3:
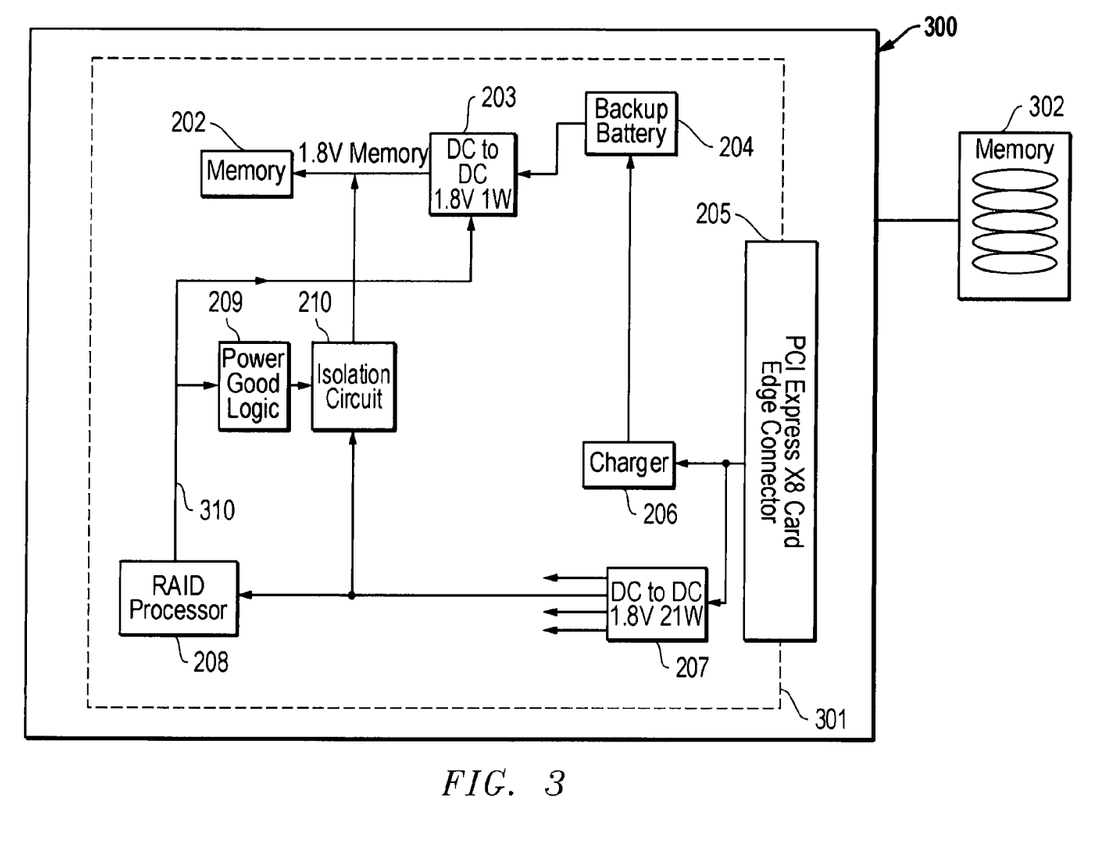
FIG. 3 is a block diagram of a battery back up and discharge circuit wherein a power supply generated from the battery provides power to circuitry of the control card during normal operations as part of the discharge cycle.

The techniques described herein provide a method and apparatus for controlling data transfer to and from a memory system, and particularly to determining battery health through a discharge cycle by providing a power supply generated by the battery to circuitry of a control card during normal operations as part of the discharge cycle. FIG. 3 shows an information handling system 300 for utilizing a memory controller circuit 301 for controlling transfer of data to and from a memory system 302 (such as for example a RAID memory system). Though shown as separate circuits, some or all of the circuits of FIG. 3 may be integrated in a single integrated circuit. As shown in FIG. 3, the controller circuit 301 may comprise a DC to DC converter 203 (1.8V 1 W), a backup battery 204, charger 206 and cache memory 202. The battery 204 is charged by a charger 206, powered through card edge connector 205. Connector 205 may be any connector or cable arrangement as known in the art, and in one example may be a PCI Express X8 connector. The card edge connector 205 may also provide power to a DC to DC converter 207 (1.8V 21 W) which supplies a variety of power supplies for normal operation of the various circuits of the controller circuit 301 (similar to as described above). A RAID processor 208 is also provided. Power good logic 209 is provided to isolate the battery power supply line from other circuitry through the use of isolation circuit 210 (which may be an FET switch) when a normal system power loss is detected similar to as described above with reference to FIG. 2. During a system power loss occurrence, the battery may be discharged at a battery C rating of approximately 1/10 C, which may be approximately 50~100 mA for a 1900 mAhr rating 103450 prismatic battery cell. It will be recognized that the techniques described herein are not limited to the particular exemplary circuit configuration shown in FIG. 3 and such configuration is merely provided as one example as the techniques described herein are applicable to many other circuit configurations. It will also be recognized that the particular voltage, power, and discharge values shown and described herein are merely exemplary and other values will be expected to be utilized, particularly as technology changes over time. For example, the various voltages and power values utilized may be higher or lower than those shown herein.

According to the techniques described herein, a battery discharge for the purposes of testing the battery health may be accomplished by powering some or all of the circuits of the controller circuit 301 during normal operations of the controller circuit 301. Thus, special discharge circuits such as the power resistors of the prior art may be avoided by providing power from the battery to normal operating circuits of the controller circuit during normal operations. In this manner, power need not be unnecessarily wasted, circuit real estate may be conserved and the thermal heat load produced during power discharge may be lessened. In one embodiment, the cache memory 202 may be the circuitry that is powered from the battery during a battery health discharge cycle, however, it will be recognized that the battery power may be utilized during a discharge cycle to power other circuitry. In one exemplary embodiment, the battery discharge rate during the battery health cycle may be at a rating of approximately 1/2 C, which may be approximately 950 mA for a 1900 Ahr 103450 prismatic battery cell. Once again, it will be recognized that the battery discharge rates are merely exemplary and the techniques described herein are not limited to any particular rates.

More particularly, a battery discharge cycle for the purposes of checking the health of a battery may be accomplished by providing a discharge enable signal 310 from the RAID processor. The discharge enable signal may activate the power good logic 209 to provide a signal to the isolation circuit 210 to isolate the cache memory 202 power input line similar to as describe above for conditions that indicate power loss has occurred. Alternatively, the battery discharge enable signal may be provided directly to the isolation circuit 210 to initiate isolation. The battery discharge enable signal may also be provided to the DC to DC converter 203 to activate the provision of power from the back up battery 204 to the memory 202. In such circumstances, battery power is provided to the cache memory 202 even though the main system power is still good and no power loss may have been detected. Thus during a normal system power state, battery power may be utilized to control the normal operations of the memory 202. Over time the battery power level will be drained. At such point power supply for the memory may be switched back to the normal system power provided through the DC to DC converter 207. The battery may then be re-charged through the use charger 206. The health of the battery may then be determined by analyzing the various characteristics of the discharge/recharge cycle as is known in the art.

The timing of the activation of the battery discharge enable signal 310 may be configured to occur automatically and periodically, such as for example every six months, or any other time period. The system may be configured to allow full user control of the battery discharge cycle, including reprogramming of the timing of the battery health discharge cycle, overriding settings or a manual user activation of the battery discharge cycle, etc.

Thus as shown and described with reference to FIG. 3, battery health discharge cycle may occur in normal power conditions in a manner that the discharged power is not wasted but rather used to reduce the power drawn from the host system during the discharge cycle. This provides a more environmentally efficient battery health discharge cycle. Further, additional heat is not created solely from the battery discharge cycle as occurs in the prior art power dissipation resistors, providing a use for power that was otherwise wasted away through a resistive load, as in prior art FIG. 2. In sum, a more efficient battery health discharge process is provided.

In one exemplary embodiment, battery discharge rate during a battery health discharge cycle may be optionally regulated to prevent fault conditions such as thermal trip, degradation of the battery, and/or an exothermic event. Such fault conditions may occur, for example, when circuitry of a memory controller (e.g., memory controller circuit 301) draws more current from a backup battery (e.g., backup battery 204) than the battery is rated for during a battery health discharge cycle, e.g., such as due to high memory traffic and utilization. In a further exemplary embodiment, the battery discharge rate may be further regulated to achieve a target optimized discharge rate (or a discharge rate that is within a target range of discharge rate values) that is sufficiently low enough to prevent occurrence of fault conditions while at the same time is high enough to minimize duration of the backup battery health conditioning cycle.

As previously described with reference to FIG. 3, power may be supplied from backup battery 204 to cache memory 202 and/or to other circuitry of memory controller circuit 301 during a battery health discharge cycle. In one exemplary embodiment, power supply for cache memory 202 and/or other circuitry of memory controller circuit 301 during battery health discharge cycle may be switched alternately between backup battery 204 and DC to DC converter 207 as necessary to prevent the current drawn from backup battery 204 by circuitry of memory controller circuit 301 during the battery health discharge cycle from exceeding a threshold current discharge value. Such a threshold current discharge value may be determined using any suitable criteria, e.g., maximum rated current discharge rate for backup battery 204 (e.g., based on battery thermal limit or to prevent battery damage or degradation), optimized current discharge rate for backup battery 204 (e.g., to optimize battery conditioning and/or accuracy of battery health management), etc.

Still referring to FIG. 3, during a battery discharge cycle an enable signal 310 may be provided as previously described to the DC to DC converter 203 to activate the provision of power from the back up battery 204 to the memory 202, and to isolate the cache memory 202 power input line from DC to DC converter 207 and other circuitry (e.g., via power good logic 209 or by a signal provided directly to the isolation circuit 210). During the battery discharge cycle, current discharge rate from backup battery 204 may be monitored and compared to a threshold current discharge value. In this regard, the measured current discharge rate may be instantaneous current flow or may be an average or other statistical value of current rate over time, such as root mean square (RMS) current. In one exemplary embodiment, measured current discharge rate may be calculated by embedded controller (EC) or other processor based on instantaneous current rate value received from a stand-alone current sense monitor, or may be a second statistical value of current rate digitally calculated by a controller or other processor/s based on a first digital value of current rate received from a battery management unit (BMU) of a smart battery or other suitable digital source of digital current rate value. If the measured current discharge rate exceeds the threshold current discharge value, then power supply for the memory 202 may be switched back from back up battery 204 to the normal system power provided through the DC to DC converter 207 (e.g., by terminating enable signal 310).

After a suitable time (e.g., from about 10 to about 15 minutes), and/or when measured current discharge rate no longer exceeds the threshold current discharge value, power supply from back up battery 204 may be again switched to memory 202 from DC to DC converter 207 (e.g., by again providing enable signal 310). This process of switching the power supply for memory 202 between backup battery 204 and DC to DC converter 207 in repetitive alternating manner (e.g., using enable signal 310) may be continued repeatedly during a battery health discharge cycle to maintain the statistical e.g., average (linear average, mean, median, etc.) value of current discharge rate over time at or below the threshold current discharge value until completion of the battery discharge cycle. It will be understood that instantaneous current discharge rate from backup battery 204 may be determined in any suitable manner, including measured by stand-alone current monitor or measured by internal battery management unit (BMU) of backup battery 204 when battery backup 204 is optionally provided as a smart battery.

It will be understood that discharge current provided by a backup battery to storage memory controller system circuitry during normal power conditions (i.e., during a time that no system power loss condition exists) may be regulated using any methodology and/or hardware configuration (e.g., hardware, software, firmware or combination thereof) suitable for switching the power supply for the storage memory controller system circuitry back and forth between a backup battery and normal system power supply component/s (e.g., DC to DC converter or other source of DC power). In this regard, backup battery discharge current regulation may be implemented, for example, by software and/or firmware executing on an embedded controller (EC), charger controller and/or other suitable microcontroller or central processing unit (CPU) of an information handling system.

Figure 4:
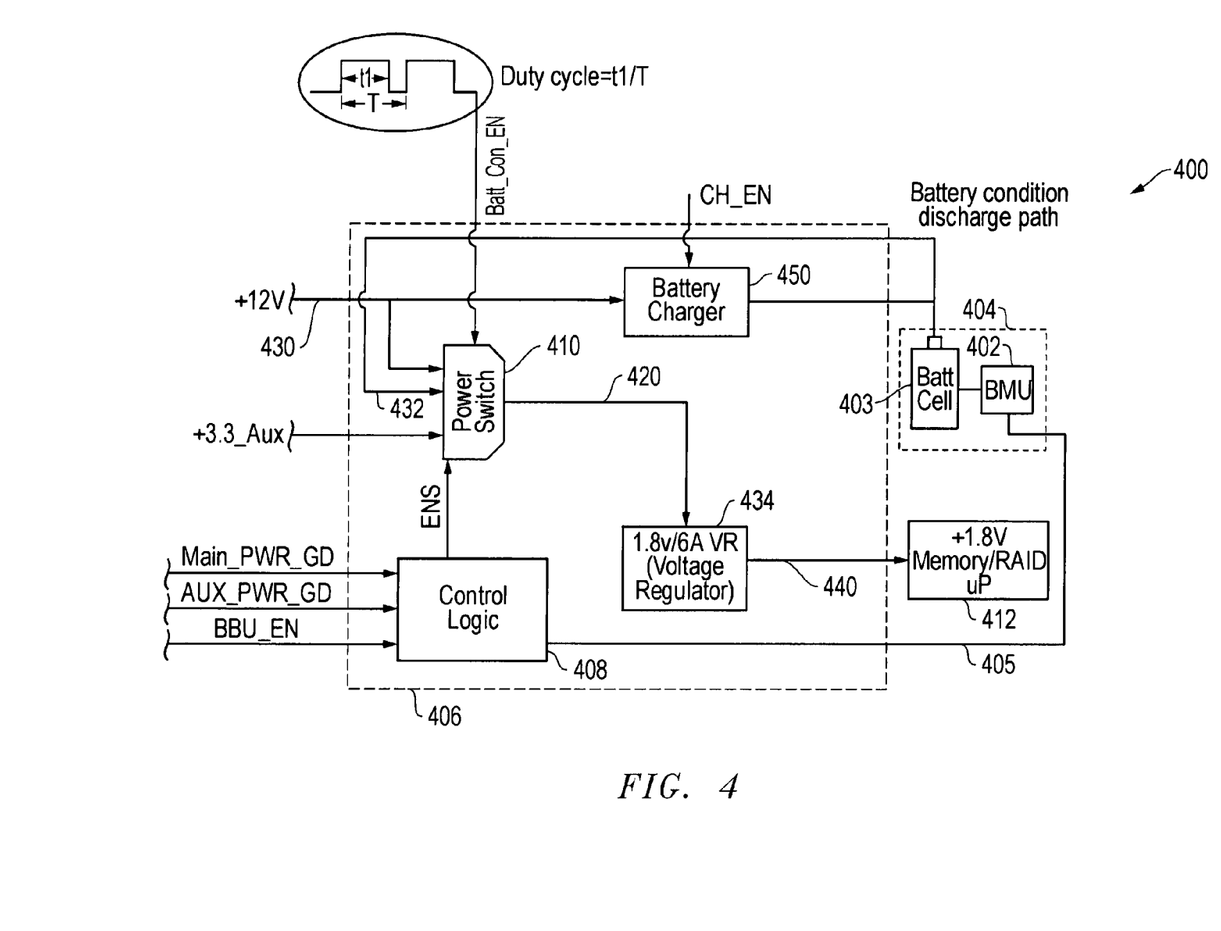
FIG. 4 is a block diagram of a battery back up and discharge circuit wherein a power supply generated from the battery is regulated to provide power to circuitry of the control card during normal operations as part of the discharge cycle.

FIG. 4 is a block diagram of one exemplary embodiment of information handling system 400 in which a power supply generated from a backup battery 404 may be regulated to provide power to storage memory controller circuitry 412 (e.g., cache memory, RAID microprocessor circuitry, etc.) during normal operations as part of the discharge cycle. In this exemplary embodiment, backup battery 404 includes battery cell/s 403 and is optionally provided with a battery management unit (BMU) 402 coupled to battery cell/s 403 and having battery current and/or battery voltage measurement capability, e.g., in the configuration of a smart battery. A battery charger 450 is provided to charge battery cell/s 403 of backup battery 404, in this case controlled charge control signal, CH_EN. As shown, BMU 402 of backup battery 404 is coupled to supply measured battery current and/or battery voltage measurement information 405 to control logic 408 of integrated charger circuitry 406. However, it will be understood that current measurement circuitry may be alternatively or additionally provided that is separate from BMU 402 or backup battery 404 to supply measured battery current and/or battery voltage measurement information 405 to control logic 408 of integrated charger circuitry 406. Control logic 408 may be software and/or firmware that may be executing by appropriate digital processor circuitry (e.g., on an embedded controller of an information handling system), and/or may be at least partially implemented utilizing analog circuitry. In one exemplary embodiment, control logic 408 may also be implemented by a charger controller or other suitable microcontroller or central processing unit (CPU) of an information handling system.

Still referring to FIG. 4, battery cell 403 is coupled to supply DC power to power switch circuitry 410 (e.g., including FET switches or other suitable switch configuration) which in this embodiment acts to selectively isolate the storage memory controller circuitry power input line 420 from normal system external power 430 (e.g., 12 volt power rail) supplied, for example, by an AC adapter. Power switch circuitry 410 is also coupled to selectively connect the storage memory controller circuitry power input line 420 to battery conditioning discharge power path 432 to supply power to storage memory controller circuitry power input line 420 from backup battery 404 as shown. In this exemplary embodiment, storage memory controller circuitry power input line 420 in turn supplies power to DC to DC converter (voltage regulator) 434, which supplies voltage regulated power 440 to storage memory controller circuitry 412. In this regard, power switch circuitry 410 may be configured to switch the power supply for cache memory and/or RAID microprocessor power input line 420 alternately between external power 430 and battery backup power 432 as necessary to prevent the current drawn from backup battery 404 by storage memory controller circuitry 412 during the battery health discharge cycle from exceeding a threshold current discharge value in a manner as previously described.

In the exemplary embodiment of FIG. 4, control logic 408 of integrated charger circuitry 406 is configured to control operation of power switch circuitry 410 to alternately supply power to storage memory controller circuitry power input line 420 from external power 430 and battery backup power 432 according to discharge duty cycle control signal Batt_Con_EN as shown. In this exemplary embodiment, a discharge duty cycle relationship of (t1/T) is employed, with t1 being the time that power is supplied to storage memory controller circuitry power input line 420 from battery backup power 432 relative to the total time T of each cycle. Therefore, the time that power is supplied to storage memory controller circuitry power input line 420 from external power 430 in this exemplary embodiment is equal to (T−t1). It will be understood that the previously described particular discharge duty cycle relationship is exemplary only and that other discharge duty cycle relationships may be employed.

In the exemplary embodiment of FIG. 4, other exemplary and optional signals are illustrated for one embodiment of the disclosed method and system. These exemplary and optional signals may be used in one embodiment to control power switch circuitry 410 and DC to DC converter (voltage regulator) 434 when the system power is lost, and the cache memory is sustained by power other than main (e.g., 12V) system power. In this event, battery condition enable signal Batt_Con_EN may no longer be valid in one exemplary embodiment.

The illustrated optional signals of FIG. 4 include BBU_EN, which indicates that there is data in the memory that needs to be retained through back up power (e.g., 3.3V_AUX or the battery). When BBU_EN is set and main power is lost, control logic 408 may set power supplied to storage memory controller circuitry power input line 420 to be 3.3V_AUX if it is present. If 3.3V_AUX is not present, then control logic 408 may set power supplied to storage memory controller circuitry power input line 420 to battery power 432. ENS represents a signal that may enable DC to DC converter (voltage regulator) 434 when there is main power or when BBU_EN is set and main power is not present. +3.3V_AUX represents auxiliary back up power that may be provided by the host system (i.e. such as a server). In some conditions, the host may still be capable of providing +3.3V_AUX back up power rail even when it is not capable of providing main system power. When BBU_EN is set and main system power is not present, this rail may be used to power storage memory controller circuitry power input line 420. Main_PWR_GD represents a signal that may be used as a qualifier to determine if the main voltage rail (12V) is stable. If the main power is stable, then this signal is active and indicates to control logic 408 to that power should be supplied to storage memory controller circuitry power input line 420 from 12V (e.g., during normal operation when BATT_CON_EN is not active). AUX_PWR_GD may detect if the 3.3V_AUX power rail is present and stable. If MAIN_PWR_GD=0 (not stable), AUX_PWR_GD=0, and BBU_EN is active, then control logic 408 may instruct power switch circuitry 410 to supply battery power to storage memory controller circuitry power input line 420.

Figure 5:
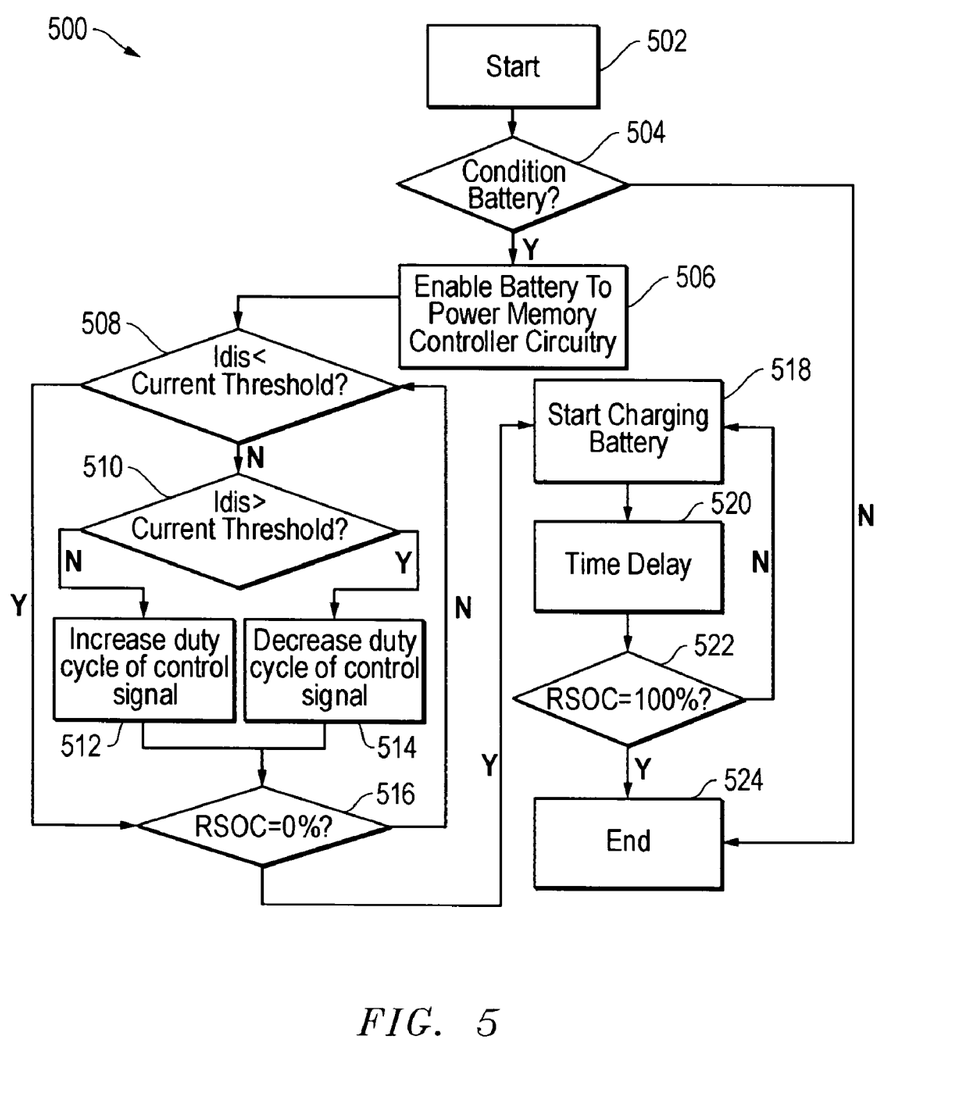
FIG. 5 illustrates methodology that may be implemented to optimize battery discharge rate during a battery health discharge cycle.

FIG. 5 shows one exemplary embodiment of methodology 500 that may be implemented to optimize battery discharge rate to storage memory controller circuitry during a battery health discharge cycle. Methodology 500 may be implemented wholly or partially, for example, using software and/or firmware that may be executing, for example, on an embedded controller, charger controller and/or other suitable microcontroller or CPU of an information handling system. Methodology 500 starts in step 502 and proceeds to step 504 where it is determined whether a battery conditioning (i.e., battery health discharge) cycle is ready to occur. If not, then methodology 500 terminates in step 524. However, if it is determined in step 502 that a battery conditioning cycle is ready to occur, then the backup battery is enabled to power memory controller circuitry in step 506, e.g., initially using a default value of the discharge duty cycle control signal such as 50%, 75%, 90%, 100%, etc. For example, given an anticipated continuous backup battery current discharge rate of 1 amp to the memory controller, an initial discharge duty cycle of 50% may be selected to achieve a target RMS current discharge rate of 500 milliamps.

Next, measured backup battery discharge current (e.g., average value of current rate over time such as RMS discharge current) is compared to a threshold current discharge value in step 508, which in one exemplary embodiment may be a target optimized current discharge value (e.g., 500 milliamps or other suitable selected current value). If in step 508 backup battery discharge current is found to be equal to the current threshold (or alternatively is found to be within a selected target range of discharge current values), then methodology 500 proceeds to step 516 where a relative state of charge (RSOC) of the backup battery is evaluated. If the RSOC of the backup battery is found to be not equal to about 0% (or alternatively is found to be greater than a minimum selected RSOC value), then methodology 500 returns to step 508 and repeats again. This process continues until the relative state of charge of the backup battery is found to be equal to about 0% (or alternatively is found to be less than or equal to a selected minimum RSOC value), at which point charging of the backup battery is initiated in step 518. After a time delay 520 the RSOC of the backup battery is checked again in step 522. If the RSOC of the backup battery is found in step 522 to be equal to about 100% (or alternatively is found to be greater than or equal to a selected maximum RSOC value), then charging operations of the backup battery are terminated in step 524.

If in step 508 backup battery discharge current (e.g., statistical value of current rate over time such as RMS discharge current) is found not to be equal to the current threshold (or alternatively is found to be outside a selected target range of current values), then methodology 500 proceeds to step 510 where it is determined whether backup battery discharge current is greater than the current threshold (or alternatively is greater than a selected target range of discharge current values). If in step 510 backup battery discharge current is greater than the current threshold (or alternatively greater than a selected target range of discharge current values), then the value of the discharge duty cycle control signal is then decreased in step 514 and methodology 500 proceeds to step 516. However, if in step 510 backup battery discharge current is not greater than the current threshold (or alternatively is not greater than a selected target range of discharge current values) this means the backup battery discharge current is less than the current threshold or selected target range of current values, and the value of the discharge duty cycle control signal is then increased (or left at 100% if already at that value) in step 512 and methodology 500 proceeds to step 516.

It will be understood that the methodology of FIG. 5 is exemplary only and that any other methodology may be employed that is suitable for regulating backup battery discharge rate to storage memory controller circuitry during a battery health discharge cycle. For example, it is not necessary that a discharge current duty cycle be employed to regulate backup battery discharge rate. In this regard, backup battery discharge current may simply be temporarily terminated (e.g., for a pre-determined time delay) whenever the measured instantaneous back up battery current discharge rate exceeds a given desired current threshold or selected target range of discharge current values, and then initiated again after passage of the time delay. In another embodiment, a discharge current duty cycle may be employed to regulate backup battery discharge current rate so that a measured statistical value (e.g., a second statistically-calculated value, such as average value (e.g., linear average, mean, median, etc.), of current rate digitally calculated from a first value of current rate reported from a BMU or other suitable digital source of digital current rate value) of current rate over time is maintained below a given maximum current threshold without the additional step of increasing backup battery discharge current rates that are below the current threshold.

Further modifications and alternative embodiments of the techniques described herein will be apparent to those skilled in the art in view of this description. It will be recognized, therefore, that the techniques described herein are not limited by these example arrangements. Accordingly, this description is to be construed as illustrative only and is for the purpose of teaching those skilled in the art the manner of carrying out the techniques described herein. It is to be understood that the forms of the techniques described herein shown and described are to be taken as the presently preferred embodiments. Various changes may be made in the implementations and architectures. For example, equivalent elements may be substituted for those illustrated and described herein and certain features of the techniques described herein may be utilized independently of the use of other features, all as would be apparent to one skilled in the art after having the benefit of this description of the techniques.

What is claimed is:

1. A method of determining the health of a backup battery in storage memory controller circuitry, said method comprising steps of:
providing the storage memory controller system circuitry with a back up battery and other control circuits, the back up battery providing a power source during occurrences of a system power loss condition;
providing a first portion of circuitry of the storage memory controller circuitry that is utilized during normal power conditions and is powered by a non-battery power source;
commencing a battery health discharge cycle of the back up battery even though normal power conditions exist;
providing a power supply generated from the back up battery to the first portion of circuitry of the storage memory controller circuitry as part of the battery health discharge cycle of the back up battery that occurs while normal system power conditions exist, the first portion of circuitry of the storage memory controller circuitry being isolated from the non-battery power source during the back up battery health discharge cycle;
discharging at least a portion of the back up battery through the first portion of circuitry of the storage memory controller during the battery health discharge cycle of the back up battery that occurs while normal system power conditions exist; and
determining a health of the back up battery after the discharging of at least a portion of the back up battery.

2. The method of claim 1, wherein the storage memory controller circuitry is a RAID controller card.

3. The method of claim 2, wherein the first portion of circuitry of the storage memory controller circuitry comprises cache memory.

4. The method of claim 1, wherein the discharge signal occurs such that battery health is capable of being automatically tested periodically.

5. The method of claim 1, wherein the discharge signal is responsive to user input to initiate a battery health test.

6. The method of claim 1, wherein the first portion of circuitry of the storage memory controller circuitry comprises cache memory.

7. The method of claim 6, further comprises isolating the cache memory from a normal power source during the battery health discharge cycle.

8. The method of claim 1, further comprising charging the back up battery as part of the battery health cycle.

9. The method of claim 8, wherein the first portion of circuitry of the storage memory controller circuitry comprises cache memory.

10. A method of utilizing a memory control circuit for controlling a transfer of data to or from a memory storage system, said method comprising steps of:
providing a RAID memory controller card having a back up battery and control circuits;
performing a battery health cycle for determining the health of the back up battery;
providing a back up battery generated power supply to at least a first portion of circuitry of the RAID memory controller card during a non-system power loss state as part of the battery health cycle, the at least a first portion of circuitry of the RAID memory controller card being circuitry that is utilized during normal power conditions by being powered by a non-battery power source;
discharging at least a portion of the charge of the back up battery through the at least a first portion of circuitry of the RAID memory control card during the non-system power loss state as part of the battery health cycle, the first portion of circuitry of the RAID memory controller card being isolated from the non-battery power source while the back up battery generated power supply is provided to the at least a first portion of circuitry of the RAID memory controller card during the non-system power loss state; and
determining a condition of the back up battery as part of the battery health cycle.

11. The method of claim 10, wherein the at least a first portion of circuitry of the RAID memory controller card that receives the battery generated power supply during a non-system power loss state as part of the battery health cycle comprises memory circuitry.

12. The method of claim 11, wherein a discharge signal occurs such that battery health is capable of being automatically tested periodically.

13. The method of claim 12, wherein the discharge signal is also responsive to user input to initiate a battery health test.

14. The method of claim 11, further comprising charging the back up battery as part of the battery health cycle.

15. The method of claim 10, further comprising charging the back up battery as part of the battery health cycle.

16. An information handling system comprising:
a back up battery;
a battery discharge signal that is indicative of an execution of a battery health cycle;
memory controller circuitry for controller the transfer of data to and from an external data storage system;
a first circuit within the memory controller circuitry that is operable in a normal power mode to receive system power in a non-power loss state;
the first circuit being coupled to the back up battery during the battery health cycle so that the battery is capable of being discharged by supplying operating power to the first circuit as part of the battery health cycle, the battery supplied operating power being utilized to operate the first circuit during normal data transfer between the memory controller circuitry and the external data storage system, and
an isolation circuit isolating the first circuit from the system power while the back up battery provides power to the first circuit during the non-power loss state.

17. The system of claim 16, wherein the memory controller circuitry is a RAID controller card.

18. The system of claim 16, further comprising charger circuitry coupled to the back up battery to charge the battery as part of the battery health cycle.

19. The method of claim 16, wherein the first circuit is a memory circuit.

20. The method of claim 19, wherein the memory controller circuitry is a RAID controller card.

* * * * *